(12) United States Patent
Higuchi et al.

(10) Patent No.: US 6,739,703 B2
(45) Date of Patent: May 25, 2004

(54) PIEZOELECTRIC ACTUATOR AND LIQUID DISCHARGE HEAD

(75) Inventors: Takamitsu Higuchi, Nagano (JP); Setsuya Iwashita, Nagano (JP); Koji Sumi, Nagano (JP); Masami Murai, Nagano (JP)

(73) Assignee: Seiko Epson Corporation (JP)

( * ) Notice: Subject to any disclaimer, the term of this patent is extended or adjusted under 35 U.S.C. 154(b) by 40 days.

(21) Appl. No.: 10/290,466

(22) Filed: Nov. 8, 2002

(65) Prior Publication Data

US 2003/0132991 A1 Jul. 17, 2003

(30) Foreign Application Priority Data

Nov. 8, 2001 (JP) .................................. 2001-343773
Nov. 5, 2002 (JP) .................................. 2002-321368

(51) Int. Cl.[7] ................................................. B41J 2/045
(52) U.S. Cl. ....................................................... 347/70
(58) Field of Search ............................ 347/68, 70, 71; 310/328, 365, 357, 358, 311

(56) References Cited

U.S. PATENT DOCUMENTS 5,589,284 A * 12/1996 Summerfelt et al. ........ 428/697
2003/0117041 A1 * 6/2003 Kurihara et al. ............ 310/328

* cited by examiner

Primary Examiner—Judy Nguyen
(74) Attorney, Agent, or Firm—Sterne, Kessler, Goldstein & Fox P.L.L.C.

(57) ABSTRACT

An optimum layer structure for a piezoelectric actuator is provided, in which strontium ruthenate oriented in (100) plane is used as a bottom electrode. The piezoelectric actuator comprises an Si substrate 20, a diaphragm 30 formed on the Si substrate 20 and comprising $SiO_2$ or $ZrO_2$, a buffer layer 32 formed on this diaphragm and comprising (100) orientation or (110) orientation SrO, a bottom electrode 42 formed on the buffer layer and comprising (100) orientation strontium ruthenate having a perovskite structure, a piezoelectric layer 43 formed on the bottom electrode and comprising (100) orientation PZT, and a top electrode 44 formed on the piezoelectric layer.

10 Claims, 5 Drawing Sheets

1: INK-JET RECORDING HEAD

PIEZOELECTRIC ACTUATOR AND LIQUID DISCHARGE HEAD

CROSS-REFERENCE TO RELATED APPLICATIONS

Not applicable.

STATEMENT REGARDING FEDERALLY-SPONSORED RESEARCH AND DEVELOPMENT

Not applicable.

REFERENCE TO MICROFICHE APPENDIX/SEQUENCE LISTING/TABLE/COMPUTER PROGRAM LISTING APPENDIX (submitted on a compact disc and an incorporation-by-reference of the material on the compact disc)

Not applicable.

BACKGROUND OF THE INVENTION

1. Field of the Invention

The present invention relates to a piezoelectric actuator comprising a piezoelectric element and a pair of electrodes disposed on either side thereof, and particularly relates to a piezoelectric actuator comprising strontium ruthenate as a bottom electrode.

2. Background Art

A piezoelectric actuator comprises a piezoelectric element in which a piezoelectric film having an electromechanical transducing function is interposed between two electrodes, the piezoelectric film being constituted by crystallized piezoelectric ceramics. Compound oxides having a perovskite crystalline structure and which can be expressed by the chemical formula $ABO_3$ are known as these piezoelectric ceramics. For example, lead zirconate titanate (PZT) in which lead (Pb) is applied to A and zirconium (Zr) and titanium (Ti) are applied to B is known.

Conventionally, Pt has been used as the electrode material of a PZT-based piezoelectric element. Since Pt has a face-centered cubic lattice structure (FCC) which is a closest packing structure, it has strong self-orientation. Therefore, when Pt is deposited on an amorphous material such as $SiO_2$, it becomes strongly oriented in (111) plane, whereby the orientation property of the piezoelectric film thereon also improves. A problem with such a strong orientation property, however, is that columnar crystal grains grow and that Pb or the like tends to diffuse into the lower layer along the grain boundary. Problems also occur in the adhesiveness of the Pt and $SiO_2$.

Further, when Ti is used in order to improve the adhesiveness of the Pt and $SiO_2$, or TiN or the like is used as a diffusion barrier layer for Pb or the like, the electrode structure becomes complicated. Also, as a result, oxidization of the Ti, diffusion of the Ti into the Pt, and a deterioration in the crystallinity of the PZT occur, and thus the electrical characteristics such as the piezoelectric characteristics deteriorate.

Since such problems exist in Pt electrodes, research is being conducted in the fields of ferroelectric memory and the like into the use of conductive oxides such as $RuO_x$, $IrO_2$ and so on as electrode materials. Among these materials, strontium ruthenate has the same perovskite crystalline structure as PZT and therefore has an excellent bonding property at the interface, eases the epitaxial growth of PZT, and also has an excellent characteristic as a Pb diffusion barrier layer.

However, when strontium ruthenate is used as the bottom electrode of a piezoelectric element, the substance constituting the layer therebelow must have physical properties as a diaphragm and chemical properties to appropriately control the orientation of the strontium ruthenate and maintain adhesiveness with the substrate and bottom electrode.

BRIEF SUMMARY OF THE INVENTION

An object of the present invention is to provide a piezoelectric actuator which comprises an optimum layer structure for a case in which strontium ruthenate oriented in (100) plane is used as a bottom electrode. It is a further object to provide a liquid discharge head comprising this piezoelectric actuator.

A piezoelectric actuator according to the present invention comprises a diaphragm formed on an Si substrate and comprising $SiO_2$, $ZrO_2$, or a laminated structure of $SiO_2$ and $ZrO_2$, a buffer layer formed on the diaphragm and comprising (100) orientation or (110) orientation SrO, a bottom electrode formed on the buffer layer and comprising (100) orientation strontium ruthenate having a perovskite structure, a piezoelectric layer formed on the bottom electrode and comprising (100) orientation PZT, and a top electrode formed on the piezoelectric layer.

In this piezoelectric actuator, it is desirable that the bottom electrode comprises $SrRuO_3$ layer adjacent to the piezoelectric layer. In this manner, the conductivity of the bottom electrode and the orientation control of the piezoelectric film can be sufficiently maintained.

In this piezoelectric actuator, it is desirable for the buffer layer to be entirely covered by the diaphragm and the bottom electrode. In this way the SrO, which has a deliquescent property, can be prevented from contacting outside air.

A liquid discharge head of the present invention comprises the aforementioned piezoelectric actuator, and comprises in the aforementioned Si substrate pressure chambers which are constituted so as to be capable of volumetric change caused by vibration of the diaphragm provided in the piezoelectric actuator.

A liquid discharge device of the present invention comprises the aforementioned liquid discharge head as printing means.

BRIEF DESCRIPTION OF THE DRAWINGS/FIGURES

DETAILED DESCRIPTION OF THE INVENTION

Overall Constitution of Ink Jet Printer

Figure 1:
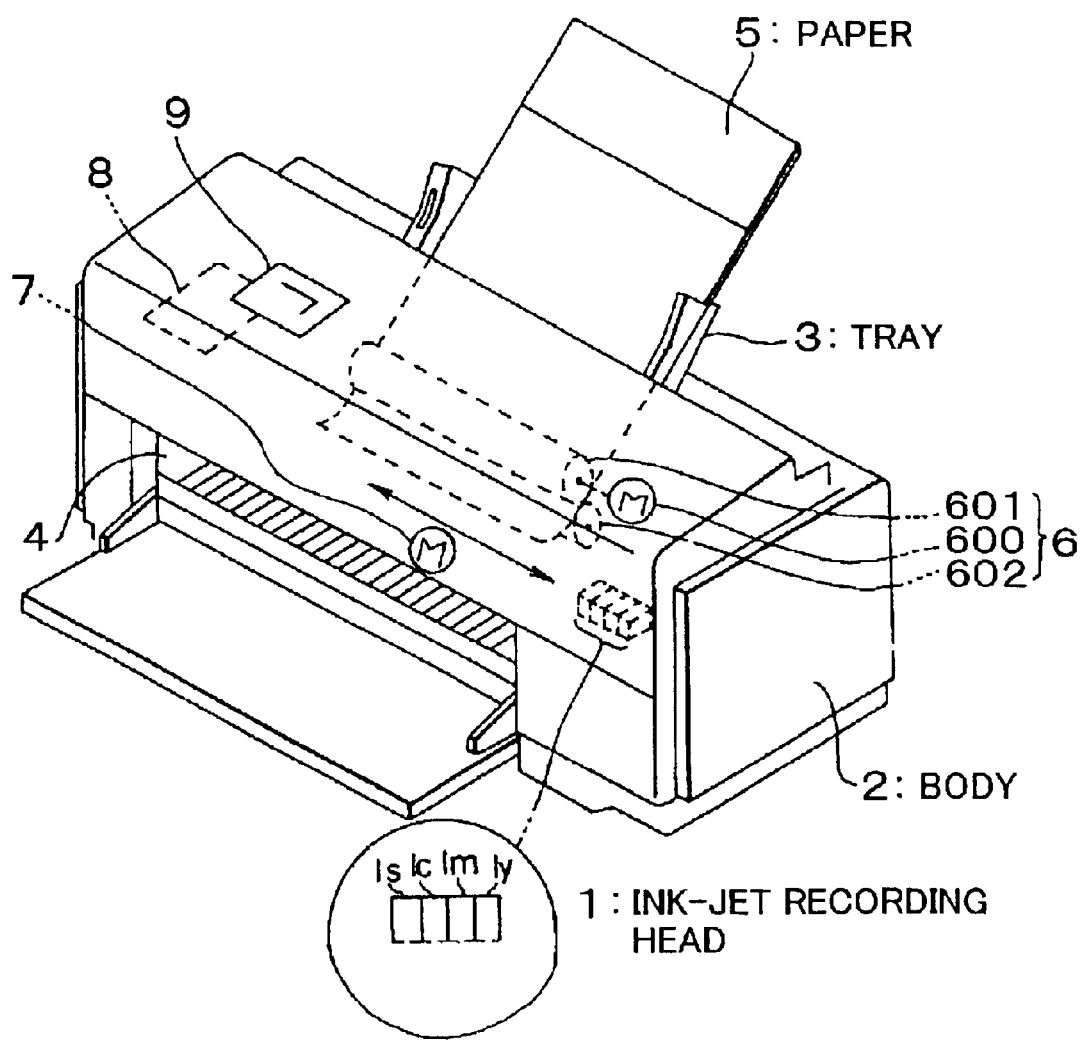
FIG. 1 is a constitutional diagram of an ink jet printer comprising a piezoelectric actuator according to an embodiment of the present invention.

FIG. 1 is a constitutional diagram of an ink jet printer which is one example of a liquid discharge device comprising the piezoelectric actuator according to an embodiment of the present invention. The ink jet printer mainly comprises an ink jet recording head 1, a body 2, a tray 3, and a head driving mechanism 7.

The ink jet recording head 1 is one example of the liquid discharge head of the present invention. The ink jet printer comprises a total of four color ink cartridges, yellow, magenta, cyan, and black, so as to be capable of full color printing. This ink jet printer also comprises in its interior a special controller board and the like, by means of which the ink discharge timing of the ink jet recording head 1 and the scanning of the driving mechanism 7 are controlled.

The body 2 is provided with a tray 3 on its back surface, and an auto sheet feeder (automatic continuous paper supply mechanism) 6 is provided in the interior thereof for automatically feeding paper 5 and discharging this paper 5 from a discharge port 4 on the front surface.

Overall Constitution of Ink Jet Recording Head

Figure 2:
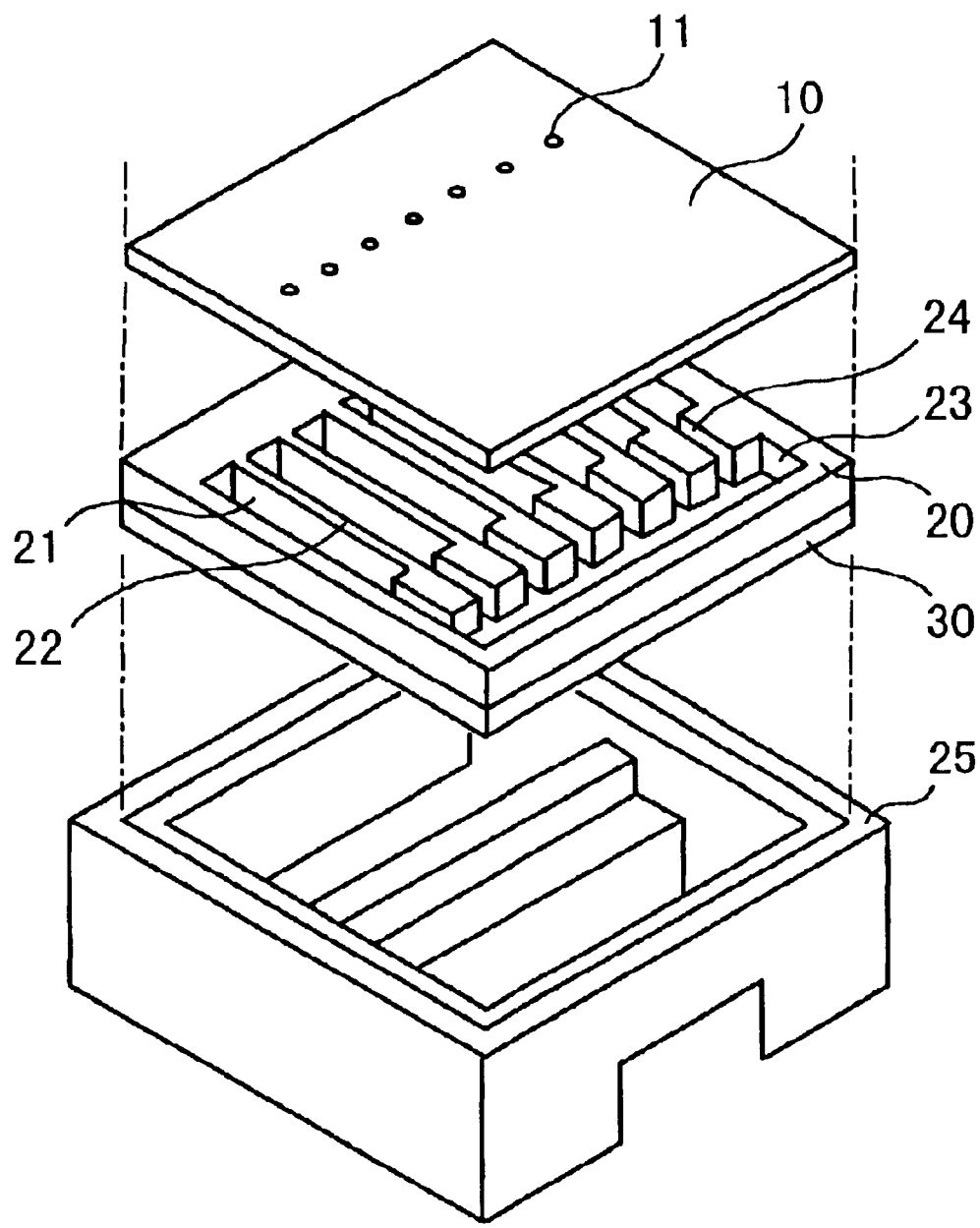
FIG. 2 is an exploded perspective view of an example of an ink jet recording head of the present invention.

In FIG. 2, an exploded perspective view of the aforementioned ink jet recording head is shown. The ink jet recording head 1 comprises a pressure chamber substrate (Si substrate) 20, a diaphragm 30 which is fixed onto one surface thereof, and a nozzle plate 10 which is fixed onto the other surface thereof. This head 1 is constituted by an on-demand type piezo jet head.

The pressure chamber substrate 20 comprises pressure chambers (cavities) 21, side walls (partitions) 22, a reservoir 23, and supply ports 24. The pressure chambers 21 are storage spaces for discharging liquid such as ink. The side walls 22 are formed so as to partition the plurality of pressure chambers 21. The reservoir 23 is a common channel for filling each of the pressure chambers 21 with ink. The supply ports 24 are formed to be capable of leading ink into the pressure chambers 21 from the reservoir 23.

The nozzle plate 10 is bonded to the pressure chamber substrate 20 such that nozzles 11 formed therein are disposed in positions which correspond to each of the pressure chambers 21 provided in the pressure chamber substrate 20. The pressure chamber substrate 20 bonded with the nozzle plate 10 is housed inside a cabinet 25.

A piezoelectric actuator (to be described below) is provided in the diaphragm 30. An ink tank port (not shown) is provided in the diaphragm 30 such that the ink which is stored in the ink tank (not shown) can be supplied to the reservoir 23.

Layer Structure

Figure 3:
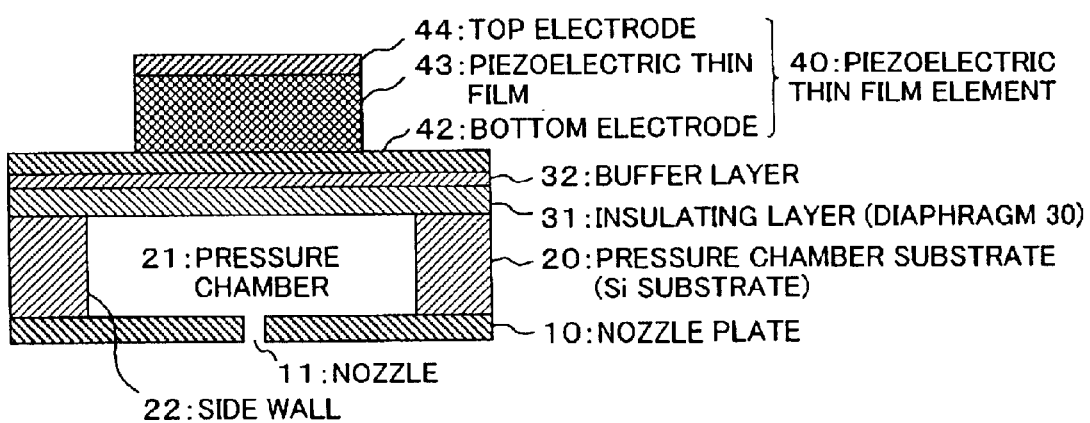
FIG. 3 is a sectional view illustrating a layer structure of the ink jet recording head and the piezoelectric actuator manufactured according to a manufacturing method of the present invention.

FIG. 3 is a sectional view illustrating a layer structure of the ink jet recording head and the piezoelectric actuator manufactured according to a manufacturing method of the present invention. As is illustrated in the figure, the piezoelectric actuator is constituted by the lamination of an insulating film 31 (diaphragm 30) on the Si substrate 20, a buffer layer 32, a bottom electrode 42, a piezoelectric thin film 43, and a top electrode 44.

The insulating film 31 is constituted by a non-conductive material, particularly amorphous silicon dioxide ($SiO_2$), zirconia ($ZrO_2$), or a laminated body of zirconia and silicon dioxide. The insulating film 31 is deformed by deformation of the piezoelectric layer and functions as the diaphragm 30 for momentarily raising pressure inside the pressure chambers 21.

The buffer layer 32 is constituted by strontium oxide (SrO) oriented in (100) or (110) plane. This buffer layer 32 is disposed on the insulating film 31 and is appropriate for causing epitaxial growth of the bottom electrode 42. Furthermore, although not shown in the figure, the buffer layer 32 is formed in a narrower region than the formation region of the bottom electrode, and it is desirable that the entire buffer layer 32 be covered by the insulating film 31 and the bottom electrode 42. In so doing, strontium oxide, which has a deliquescent property, can be prevented from contact with outside air. The buffer layer 32 is not limited to the above, and may also be constituted by magnesium oxide (MgO), calcium oxide (CaO), barium oxide (BaO), and so on.

The bottom electrode 42 is one of the electrodes for applying a voltage to the piezoelectric thin film layer 43, and is formed in the same region as the insulating film 31 in order to function as a common electrode for a plurality of piezoelectric thin film elements formed on the pressure chamber substrate 20. Note, however, that the bottom electrode 42 may also be formed with the same magnitude as the piezoelectric thin film layer 43, or in other words in the same shape as the top electrode. The bottom electrode 42 is constituted by a conductive metal oxide, particularly strontium ruthenate (SRO) oriented in (100) plane. A structure in which an iridium or platinum layer is interposed between two SRO layers may also be employed.

The SRO is of a perovskite structure, and is expressed by $Sr_{n+1}Ru_nO_{3n+1}$ (where n is an integer of one or more). When n=1, this becomes $Sr_2RuO_4$, when n=2, this becomes $Sr_3Ru_2O_7$, and when n=∞, this becomes $SrRuO_3$. When SRO is used as the bottom electrode in this embodiment, $SrRuO_3$ is most preferable so that conductivity and also crystallinity in the piezoelectric thin film can be enhanced. If an iridium or platinum layer is interposed between two SRO layers, it is particularly preferable that the SRO layer adjacent to the piezoelectric thin film layer is $SrRuO_3$.

The piezoelectric thin film layer 43 is a piezoelectric ceramic material having a perovskite crystalline structure, and is formed in a predetermined shape on top of the bottom electrode 42. As for the composition of the piezoelectric thin film layer 43, lead zirconate titanate ($Pb(Zr, Ti)O_3$: PZT) or PZT with an additive such as magnesium or niobium added is particularly preferable. The composition is not limited thereto, however, and lead lanthanum titanate (($Pb, La)TiO_3$), lead lanthanum zirconate (($Pb, La) ZrO_3$), and so on may also be used. The PZT is preferably of a rhombohedral crystal structure and oriented in (100) plane.

The top electrode 44 is the other electrode for applying a voltage to the piezoelectric thin film layer 43, and is constituted by a conductive material such as platinum (Pt), iridium (Ir), or aluminum (Al), for example. If aluminum is used, iridium or the like is laminated thereon to prevent electric corrosion.

Operations of the Ink Jet Recording Head

The operations of the aforementioned ink jet recording head 1 will now be described. When no predetermined discharge signal is supplied and a voltage is not applied between the bottom electrode 42 and the top electrode 44 of the piezoelectric thin film element 40, no deformation occurs in the piezoelectric thin film layer 43. When no discharge signal is supplied to the piezoelectric thin film element 40, no pressure change is produced in the pressure chamber 21 in which the piezoelectric thin film element 40 is provided, and thus no ink droplets are discharged from the nozzle 11 thereof.

However, when a predetermined discharge signal is supplied and a predetermined voltage is applied between the bottom electrode 42 and the top electrode 44 of the piezoelectric thin film element 40, deformation occurs in the piezoelectric thin film layer 43. When a discharge signal is supplied to the piezoelectric thin film element 40, the diaphragm 30 of the pressure chamber 21 corresponding to the piezoelectric thin film element 40 greatly yields. As a result, the pressure inside the pressure chamber 21 rises momentarily, and ink droplets are discharged from the nozzle 11. By supplying individual discharge signals to piezoelectric elements in positions on the slender head where printing is desired, desired characters and figures can be printed.

Manufacturing Method

A manufacturing process for the piezoelectric actuator of this embodiment will be described with reference to FIG. 4 and in conjunction with a description of a manufacturing process of the ink jet recording head.

Formation of Substrate and Insulating Layer (S1)

Figure 4:
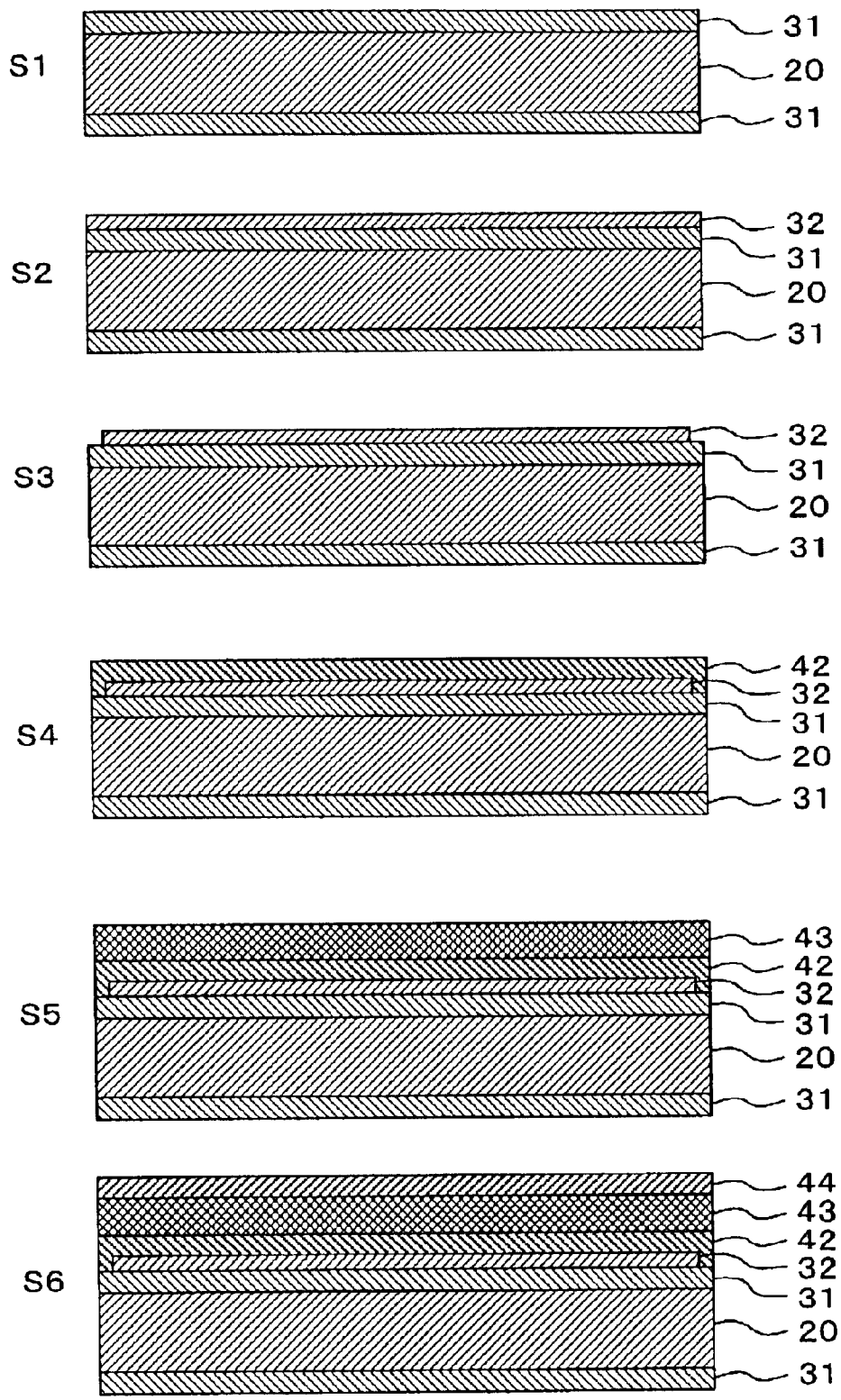
FIG. 4 is a sectional view of the manufacturing process of the piezoelectric actuator.

First, as is illustrated in FIG. 4 (S1), the insulating film 31 is deposited as a diaphragm on the pressure chamber substrate 20. A single-crystal silicon substrate oriented in (110) plane and with a diameter of 100 mm and a thickness of 200 $\mu$m, for example, is used as the pressure chamber substrate 20. The insulating film 31 is subjected to thermal oxidation in dry oxygen for approximately 22 hours in a 110° C. furnace to thereby form a thermally oxidized film with a film thickness of 2 $\mu$m or less, and preferably of approximately 1 $\mu$m. In this method, an insulating film 31 consisting of $SiO_2$ is formed on both faces of the Si substrate 20. One of these insulating films 31 serves as the diaphragm 30.

Alternatively, another film formation method such as CVD may be appropriately selected. Further, as noted above, the insulating film 31 (diaphragm 30) is not limited to silicon dioxide, but may also be formed from a zirconia film or the like.

Formation of the Buffer Layer (S2)

Next, as is illustrated in FIG. 4 (S2), the buffer layer 32 is formed on top of the insulating film 31 from strontium oxide (SrO). This is performed using a laser ablation method with ion beam irradiation, for example, in the following manner.

First, the substrate 20 is loaded into a substrate holder and disposed in a vacuum device.

In the vacuum device, a first target (buffer layer target) comprised of the constitutional elements of the buffer layer 32 as described above is disposed facing the substrate 20 with a predetermined distance therefrom. It is preferable that the composition of the first target is identical or similar to the desired composition of the buffer layer 32.

Next, when laser beams are irradiated onto the first target, for example, atoms including oxygen atoms and metal atoms are knocked out of the first target to generate a plume. In other words, this plume is irradiated toward the insulating film 31. The plume then contacts the surface of the insulating film 31 (substrate 20).

Simultaneously, ion beams are irradiated at a predetermined angle onto the surface of the insulating film 31.

As a result, the buffer layer 32 is formed on the insulating film 31 oriented in both a perpendicular direction to the surface and a parallel direction to the surface (in-plane orientation).

As for the method of knocking atoms out of the first target, a method in which argon gas (inert gas) plasma or electron rays or the like are irradiated onto the surface of the first target, for example, may be used instead of the method of irradiating the surface of the first target with laser beams.

From among these methods of knocking atoms out of the first target, the method of irradiating the surface of the first target with laser beams is particularly preferable. According to this method, atoms can be knocked out of the first target easily and surely using a vacuum device with a simple constitution comprising a laser beam entrance window.

These laser beams should preferably be pulsed light with a wavelength of approximately 150 to 300 nm and a pulse length of approximately 1 to 100 ns. More specifically, excimer lasers such as ArF excimer laser, KrF excimer laser, and XeCl excimer laser, YAG laser, $YVO_4$ laser, $CO_2$ laser, and so on can be cited as examples of the laser beams. From among these lasers, ArF excimer laser or KrF excimer laser is particularly preferable for use as the laser beams. ArF excimer laser and KrF excimer laser are both easy to handle and can knock atoms out of the first target efficiently.

There are no particular limitations on the ion beams which are irradiated onto the surface of the insulating film 31, and may be ions of at least one type of inert gas such as argon, helium, neon, xenon, or krypton, for example, or may be a mixture of these ions with oxygen ions.

As the ion source of these ion beams, it is preferable to use a Kaufmann ion source or the like. By using this ion source, ion beams can be generated comparatively easily.

There are no particular limitations on the angle of irradiation (the aforementioned predetermined angle) in respect of the surface of the insulating film 31 of the ion beams, but this angle should preferably be between approximately 42° and 47°. By irradiating the surface of the insulating film 31 with ion beams set to such an angle of irradiation, the buffer layer 32 can be formed with a cubic (100) orientation and in-plane orientation.

The conditions for the formation of the buffer layer 32 are arbitrary as long as the buffer layer 32 can be formed with in-plane orientation, and may be set as follows, for example.

The frequency of the laser beams is preferably 30 Hz or less, and more preferably 15 Hz or less.

The energy density of the laser beams is preferably at least 0.5 $J/cm^2$, and more preferably at least 2 $J/cm^2$.

The acceleration voltage of the ion beams is preferably between approximately 100 and 300 eV, and more preferably between approximately 150 and 250 eV.

The irradiation dose of ion beams is preferably between approximately 1 and 30 mA, and more preferably between approximately 5 and 15 mA.

The temperature of the substrate 20 is preferably between approximately 0 and 100° C., and more preferably between approximately 30 and 70° C.

The distance between the substrate 20 and the first target is preferably 60 mm or less, and more preferably 45 mm or less.

The pressure inside the vacuum device is preferably $1 \times 10^{-1}$ Torr or less, and more preferably $1 \times 10^{-3}$ Torr or less.

The atmosphere inside the vacuum device, with the mixing ratio of inert gas and oxygen expressed as a volume ratio, is preferably from approximately 300:1 to 10:1, and more preferably from approximately 150:1 to 50:1.

If the conditions of formation of the buffer layer 32 are within these respective ranges, the buffer layer 32 can be efficiently caused to grow with in-plane orientation.

Further, by appropriately setting the amount of irradiation time of the laser beams and ion beams, the average thickness of the buffer layer 32 can be regulated to within the aforementioned range. This amount of laser beam and ion beam irradiation time differs according to variation of the aforementioned conditions, but it is preferably 200 seconds or less, and more preferably 100 seconds or less.

According to this formation method of the buffer layer 32, the orientation can be adjusted in an arbitrary direction using the simple method of adjusting the angle of irradiation of the ion beams. This method is also advantageous in that the orientation of the buffer layer 32 can be arrayed with a high level of precision, and thus the average thickness of the buffer layer 32 can be reduced.

Since SrO preserves the adhesiveness of the interface and also possesses deliquescence, it is preferable for the film to be thin, for example 10 nm or less. The same effects are obtained when MgO, CaO, or BaO are used in the buffer layer 32 instead of SrO. Further, the buffer layer 32 is not limited to a laser ablation method, and may be formed by a well-known type of PVD (physical vapor deposition) such as sputtering.

By means of the above-mentioned method, a (100) SrO film with in-plane orientation (biaxial orientation) is formed.

Etching of the Buffer Layer (S3)

As is illustrated in FIG. 4 (S3), the periphery of the buffer layer 32 is selectively etched by anisotropic etching or the like. As a result, the entire buffer layer 32 is covered by the insulating film 31 and the bottom electrode 42 when the bottom electrode 42 is later formed. This etching process may be omitted depending on the thickness and deposition method of the bottom electrode to be described below.

Formation of the Bottom Electrode (S4)

As is illustrated in FIG. 4 (S4), the bottom electrode 42 is deposited on top of the buffer layer 32. As the bottom electrode 42, the aforementioned SRO, or a laminated structure of SRO/Pt/SRO or SRO/Ir/SRO is deposited at a thickness of approximately 500 nm. This may be performed using a laser ablation method, for example, in the following manner.

Prior to the formation of the bottom electrode 42, a second target (bottom electrode target) comprised of the constitutional elements of the bottom electrode 42 as described above is disposed in place of the aforementioned first target facing the buffer layer 32 (substrate 20) with a predetermined distance. It is preferable that the composition of the second target is identical or similar to the desired composition of the bottom electrode 42.

A plume of atoms including oxygen atoms and various metal atoms is irradiated onto the buffer layer 32. Then, when this plume contacts the surface (upper surface) of the buffer layer 32, the bottom electrode 42 comprising a metal oxide with a perovskite structure (as described above) is formed in film form by epitaxial growth.

It is preferable that this plume be generated when atoms including oxygen atoms and various metal atoms are knocked out of the second target due to the irradiation of laser beams onto the surface of the second target in a similar manner to the formation of the buffer layer (S2).

As in the formation of the buffer layer (S2), ArF excimer laser or KrF excimer laser is preferable as these laser beams.

If necessary, the bottom electrode 42 may be formed by simultaneously irradiating ion beams onto the surface of the buffer layer 32 as in the formation of the buffer layer (S2). In so doing, the bottom electrode 42 can be formed more efficiently.

The conditions for the formation of the bottom electrode 42 are arbitrary as long as the various metal atoms reach the top of the buffer layer 32 in a predetermined ratio (that is, a composition ratio for a metal oxide having a perovskite structure), and as long as the bottom electrode 42 can achieve epitaxial growth. These conditions may be set as follows, for example.

The frequency of the laser beams is preferably around 30 Hz or less, and more preferably around 15 Hz or less.

The energy density of the laser beams is preferably at least 0.5 $J/cm^2$, and more preferably at least 2 $J/cm^2$.

The temperature of the substrate 11 on which the buffer layer 32 is formed is preferably between approximately 300 to 800° C., and more preferably between approximately 400 to 700° C.

When ion beam irradiation is also performed, this temperature is preferably between approximately 0 and 100° C., and more preferably between approximately 30 and 70° C.

The distance between the substrate 11 with the buffer layer 12 and the second target is preferably 60 mm or less, and more preferably 45 mm or less.

The pressure in the vacuum device is preferably at least $1 \times 10^{-3}$ Torr under oxygen gas supply, and preferably at least $1 \times 10^{-5}$ Torr under atomic oxygen radical supply, for example.

When ion beam irradiation is also performed, the pressure inside the vacuum device is preferably $1 \times 10^{-1}$ Torr or less, and more preferably $1 \times 10^{-3}$ Torr or less. Also in this case, the atmosphere inside the vacuum device, with the mixing ratio of inert gas and oxygen expressed as a volume ratio, is preferably from approximately 300:1 to 10:1, and more preferably from approximately 150:1 to 50:1.

If the formation conditions of the bottom electrode 42 are within these ranges, the bottom electrode 42 can be formed even more efficiently.

Further, by appropriately setting the amount of laser beam irradiation time, the average thickness of the bottom electrode 42 can be regulated to within the aforementioned range. This amount of laser beam irradiation time differs according to variation of the aforementioned conditions, but it is preferably between approximately 3 and 90 minutes, and more preferably between approximately 15 and 45 minutes.

The method of forming the bottom electrode is not limited to laser ablation, and a well-known thin film production method such as MOCVD or sputtering may also be employed.

By means of the above-mentioned method, the bottom electrode 42 is obtained.

Formation of the Piezoelectric Thin Film (S5)

As is next illustrated in FIG. 4 (S5), the piezoelectric thin film 43 is deposited on top of the bottom electrode 42. In this embodiment, a PZT film comprising a $Pb(Zr_{0.56}Ti_{0.44})O_3$ composition is deposited using a sol-gel process, for example. More specifically, an organometallic compound such as metal alkoxide is subjected to hydrolysis and polycondensation in a solution system to thereby form a piezoelectric precursor film which is an amorphous film. This is then crystallized by baking.

The PZT undergoes crystal growth under the influence of the crystalline structure of the SRO bottom electrode. In this embodiment, PZT is deposited on the (100) orientation SRO, and as a result a PZT thin film oriented in (100) plane is formed. The thickness of the piezoelectric thin film layer is set at no less than 1 $\mu$m and no more than 2 $\mu$m, for example.

Formation of the Top Electrode (S6)

Next, as is illustrated in FIG. 4 (S6), the top electrode 44 is formed on top of the piezoelectric thin film 43. More specifically, platinum (Pt) or the like is deposited as the top electrode 44 at a film thickness of 100 nm by means of DC sputtering.

Formation of the Piezoelectric Actuator

Figure 5:
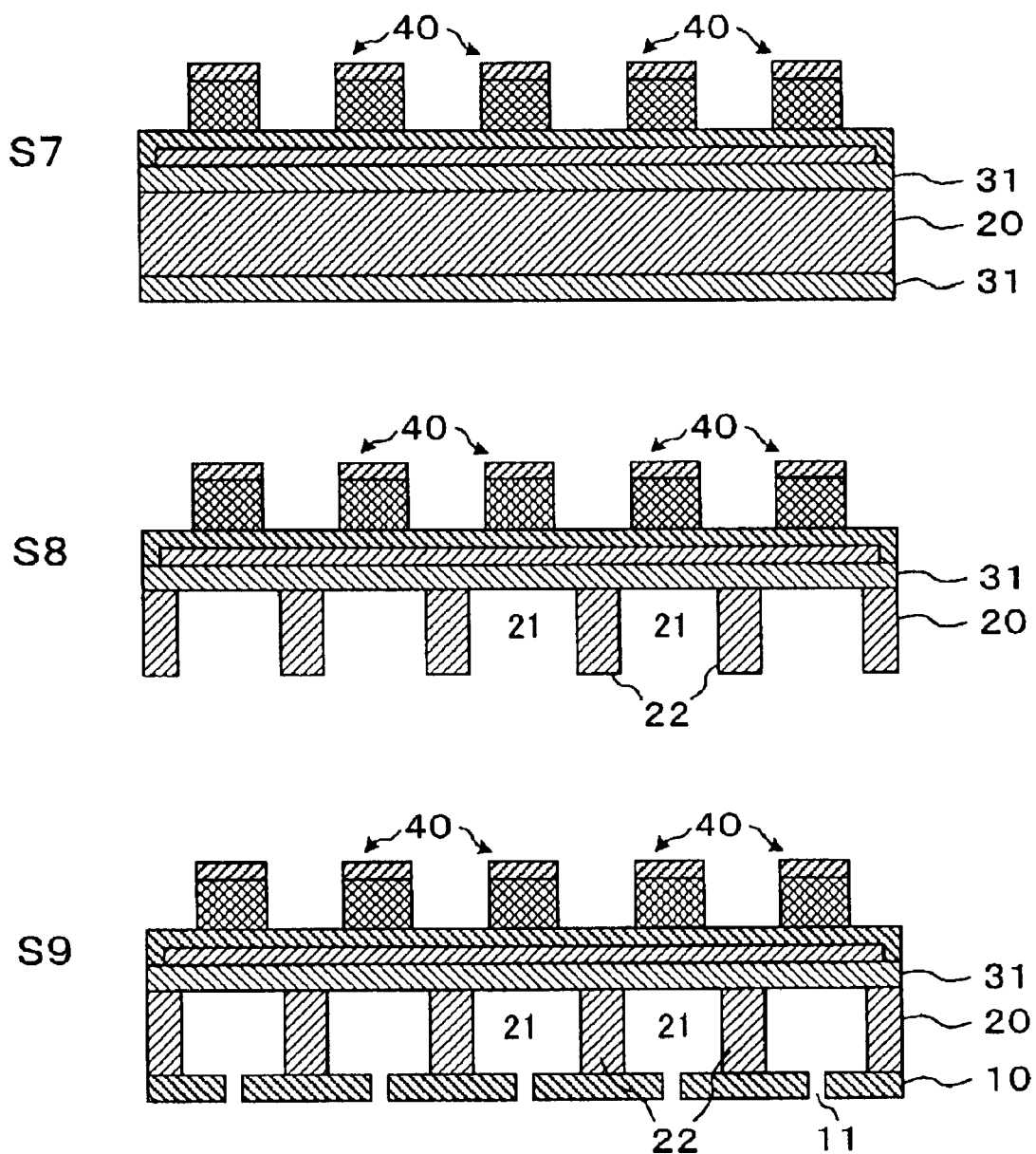
FIG. 5 is a sectional view of the manufacturing process of the ink jet recording head.

As is illustrated in FIG. 5 (S7), the piezoelectric thin film 43 and the top electrode 44 are processed into a predetermined shape to form a piezoelectric actuator. More specifically, resist is spin-coated onto the top electrode 44, whereupon the resist is patterned by exposure and development thereof in alignment with the positions at which the pressure chambers are to be formed. With the remaining resist as a mask, the top electrode 44 and the piezoelectric thin film 43 are etched by ion milling or the like. By means of this process, a piezoelectric actuator comprising piezoelectric thin film elements 40 is formed.

Formation of the Ink Jet Recording Head

As is illustrated in FIG. 5 (S8), pressure chambers 21 are formed in the pressure chamber substrate 20. In this embodiment, an Si substrate oriented in (110) plane is used as the pressure chamber substrate 20, and therefore anisotropic etching is used as the formation method of the pressure chambers 21. The remaining parts that are not etched become the side walls 22.

Finally, as is illustrated in FIG. 5 (S9), the nozzle plate 10 is bonded to the pressure chamber substrate 20 using resin or the like. When the nozzle plate 10 is to be bonded to the pressure chamber substrate 20, the position of the nozzle plate 10 is aligned such that the nozzles 11 are disposed corresponding to each of the spaces in the pressure chambers 21. By means of this process, the ink jet recording head is formed.

The liquid discharge head of the present invention may be applied not only to a head for discharging ink used in an ink jet recording device, but also to various liquid discharge heads such as a head for discharging liquid including color materials used in the manufacture of color filters for liquid crystal displays and the like, a head for discharging liquid including electrode materials used in electrode manufacture for organic EL displays, FED (field emission display), and the like, or a head for discharging liquid including organisms and organic material used in bio-chip manufacture.

According to the present invention, a piezoelectric actuator with an optimum laminated structure can be provided for a case in which strontium ruthenate oriented in (100) plane is used as a bottom electrode, and by adjusting the in-plane orientation of the piezoelectric thin film and the direction of expansion and contraction of the piezoelectric elements, a diaphragm can be made to yield efficiently. A liquid discharge head comprising this piezoelectric actuator can also be provided.

What is claimed is:

1. A piezoelectric actuator comprising:

a diaphragm formed on an Si substrate and comprising $SiO_2$, $ZrO_2$, or a laminated structure of $SiO_2$ and $ZrO_2$;

a buffer layer formed on said diaphragm and comprising (100) orientation or (110) orientation SrO;

a bottom electrode formed on said buffer layer and comprising (100) orientation strontium ruthenate having a perovskite structure;

a piezoelectric layer formed on said bottom electrode and comprising (100) orientation PZT; and a top electrode formed on said piezoelectric layer.

2. The piezoelectric actuator according to claim 1, wherein said bottom electrode comprises $SrRuO_3$ layer adjacent to said piezoelectric layer.

3. The piezoelectric actuator according to claim 2, wherein said buffer layer is entirely covered by said diaphragm and said bottom electrode.

4. A liquid discharge head comprising the piezoelectric actuator according to claim 3, further comprising, in said Si substrate, pressure chambers which are constituted so as to be capable of volumetric change caused by the vibration of said diaphragm which is provided in said piezoelectric actuator.

5. A liquid discharge device comprising the liquid discharge head according to claim 4 as printing means.

6. A liquid discharge head comprising the piezoelectric actuator according to claim 2, further comprising, in said Si substrate, pressure chambers which are constituted so as to be capable of volumetric change caused by the vibration of said diaphragm which is provided in said piezoelectric actuator.

7. A liquid discharge device comprising the liquid discharge head according to claim 6 as printing means.

8. The piezoelectric actuator according to claim 1, wherein said buffer layer is entirely covered by said diaphragm and said bottom electrode.

9. A liquid discharge head comprising the piezoelectric actuator according to claim 8, further comprising, in said Si substrate, pressure chambers which are constituted so as to be capable of volumetric change caused by the vibration of said diaphragm which is provided in said piezoelectric actuator.

10. A liquid discharge device comprising the liquid discharge head according to claim 9 as printing means.

* * * * *